(12) United States Patent
Hung et al.

(10) Patent No.: US 8,835,983 B2
(45) Date of Patent: *Sep. 16, 2014

(54) NITRIDE SEMICONDUCTOR DEVICE INCLUDING A DOPED NITRIDE SEMICONDUCTOR BETWEEN UPPER AND LOWER NITRIDE SEMICONDUCTOR LAYERS

(71) Applicant: Kabushiki Kaisha Toshiba, Minato-ku (JP)

(72) Inventors: Hung Hung, Kanagawa-ken (JP); Tomonari Shioda, Kanagawa-ken (JP); Jongil Hwang, Kanagawa-ken (JP); Naoharu Sugiyama, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/062,699

(22) Filed: Oct. 24, 2013

(65) Prior Publication Data

US 2014/0048770 A1 Feb. 20, 2014

Related U.S. Application Data

(62) Division of application No. 13/405,903, filed on Feb. 27, 2012.

(30) Foreign Application Priority Data

Oct. 11, 2011 (JP) ................. 2011-224367

(51) Int. Cl.
  *H01L 21/02* (2006.01)
  *H01L 29/778* (2006.01)
  *H01L 33/12* (2010.01)
  *H01L 29/812* (2006.01)
  *H01L 31/10* (2006.01)
  *C30B 23/02* (2006.01)
  *C30B 29/40* (2006.01)
  *H01L 33/04* (2010.01)
  *C30B 25/18* (2006.01)
  *H01L 29/20* (2006.01)
  *H01L 33/00* (2010.01)

(52) U.S. Cl.
  CPC .......... *H01L 33/04* (2013.01); *H01L 21/02505* (2013.01); *H01L 21/02458* (2013.01); *H01L 21/0254* (2013.01); *H01L 21/0262* (2013.01); *H01L 29/2003* (2013.01); *H01L 29/7787* (2013.01); *H01L 33/12* (2013.01); *H01L 29/812* (2013.01); *H01L 31/10* (2013.01); *H01L 29/778* (2013.01); *C30B 23/02* (2013.01); *C30B 29/403* (2013.01); *H01L 33/007* (2013.01); *H01L 21/02381* (2013.01); *C30B 25/183* (2013.01)
  USPC ..................... 257/190; 257/194; 257/E29.246

(58) Field of Classification Search
  USPC ................. 257/E29.089, E33.008, E21.09, 76
  See application file for complete search history.

(56) References Cited

U.S. PATENT DOCUMENTS

| 6,242,764 B1 | 6/2001 | Ohba et al. |
| 7,825,432 B2 | 11/2010 | Saxler et al. |
| 2013/0087762 A1* | 4/2013 | Hung et al. ..................... 257/13 |

FOREIGN PATENT DOCUMENTS

| JP | 9-116130 A | 5/1997 |
| JP | 2000-277441 A | 10/2000 |
| JP | 2003-234502 A | 8/2003 |
| JP | 2004-296717 A | 10/2004 |
| JP | 2006-332125 A | 12/2006 |
| JP | 2010-232293 A | 10/2010 |
| JP | 2011-23642 A | 2/2011 |
| JP | 2012-33575 A | 2/2012 |
| JP | 2012-243807 | 12/2012 |

| | | |
|---|---|---|
| JP | 2012-256833 | 12/2012 |
| WO | WO 2009/001888 A1 | 12/2008 |

OTHER PUBLICATIONS

Japanese Office Action issued Jun. 28, 2012 in patent application No. 2011-224367 with English translation.

\* cited by examiner

*Primary Examiner* — Bilkis Jahan
(74) *Attorney, Agent, or Firm* — Oblon, Spivak, McClelland, Maier & Neustadt, L.L.P.

(57) ABSTRACT

According to one embodiment, a nitride semiconductor wafer includes a silicon substrate, a lower strain relaxation layer provided on the silicon substrate, an intermediate layer provided on the lower strain relaxation layer, an upper strain relaxation layer provided on the intermediate layer, and a functional layer provided on the upper strain relaxation layer. The intermediate layer includes a first lower layer, a first doped layer provided on the first lower layer, and a first upper layer provided on the first doped layer. The first doped layer has a lattice constant larger than or equal to that of the first lower layer and contains an impurity of $1 \times 10^{18}$ cm$^{-3}$ or more and less than $1 \times 10^{21}$ cm$^{-3}$. The first upper layer has a lattice constant larger than or equal to that of the first doped layer and larger than that of the first lower layer.

7 Claims, 10 Drawing Sheets

N ITRIDE SEMICONDUCTOR DEVICE
INCLUDING A DOPED NITRIDE
SEMICONDUCTOR BETWEEN UPPER AND
LOWER NITRIDE SEMICONDUCTOR
LAYERS

CROSS-REFERENCE TO RELATED
APPLICATIONS

This application is a divisional of U.S. application Ser. No. 13/405,903 filed Feb. 27, 2012, and is based upon and claims the benefit of priority from the prior Japanese Patent Application No. 2011-224367, filed on Oct. 11, 2011; the entire contents of each of which are incorporated herein by reference.

FIELD

Embodiments described herein relate generally to a nitride semiconductor wafer, a nitride semiconductor device, and a method for growing a nitride semiconductor crystal.

BACKGROUND

Nitride semiconductors are used in various fields such as optical devices including light emitting and light receiving devices, and high speed electronic devices including radio frequency devices.

Silicon substrates are superior in mass productivity. However, in a nitride semiconductor crystal formed on a silicon substrate, cracks and other defects are likely to occur due to the difference in lattice constant or thermal expansion coefficient. Furthermore, to achieve high performance, there is demand for a high quality crystal with few dislocations.

DETAILED DESCRIPTION

Figure 1:
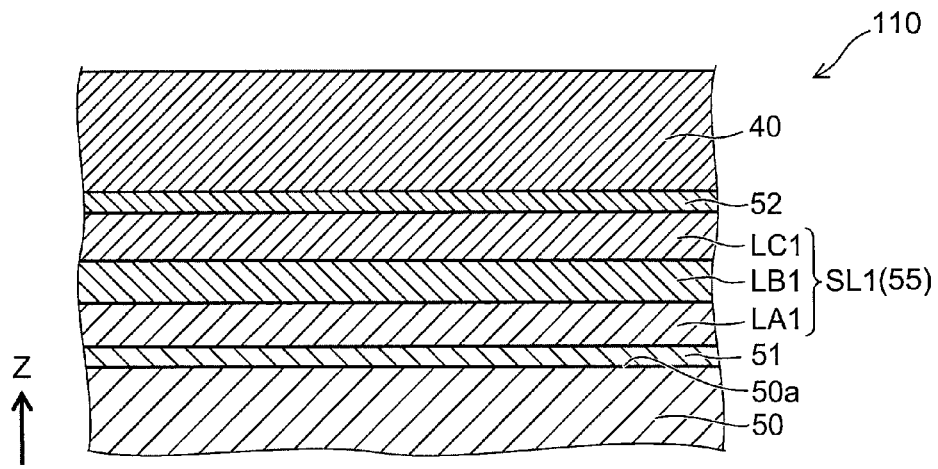
FIG. 1 is a schematic sectional view illustrating a nitride semiconductor wafer according to the first embodiment.

According to one embodiment, a nitride semiconductor wafer includes a silicon substrate, a lower strain relaxation layer, an intermediate layer, an upper strain relaxation layer, and a functional layer. The silicon substrate has a major surface. The lower strain relaxation layer is provided on the major surface and includes a nitride semiconductor. The lower strain relaxation layer has a first lattice constant. The intermediate layer is provided on the lower strain relaxation layer and includes a nitride semiconductor. The upper strain relaxation layer is provided on the intermediate layer and includes a nitride semiconductor. The functional layer is provided on the upper strain relaxation layer and includes a nitride semiconductor. The intermediate layer includes a first lower layer, a first doped layer, and a first upper layer. The first lower layer is provided on the lower strain relaxation layer and includes a nitride semiconductor. The first lower layer has a second lattice constant larger than the first lattice constant. The first doped layer is provided on the first lower layer. The first doped layer includes a nitride semiconductor. The first doped layer has a third lattice constant larger than or equal to the second lattice constant and containing an impurity at a concentration of $1 \times 10^{18}$ cm$^{-3}$ or more and less than $1 \times 10^{21}$ cm$^{-3}$. The first upper layer is provided on the first doped layer. The first upper layer includes a nitride semiconductor. The first upper layer has a fourth lattice constant larger than or equal to the third lattice constant and larger than the second lattice constant.

According to another embodiment, a nitride semiconductor device includes an intermediate layer, an upper strain relaxation layer, and a functional layer. The intermediate layer is formed on a major surface of a silicon substrate and includes a nitride semiconductor. The upper strain relaxation layer is provided on the intermediate layer and includes a nitride semiconductor. The functional layer is provided on the upper strain relaxation layer and includes a nitride semiconductor. The intermediate layer includes a first lower layer, a first doped layer, and a first upper layer. The first lower layer is formed on the major surface and includes a nitride semiconductor. The first doped layer is provided on the first lower layer. The first doped layer includes a nitride semiconductor. The first doped layer has a lattice constant larger than or equal to lattice constant of the first lower layer and containing an impurity at a concentration of $1 \times 10^{18}$ cm$^{-3}$ or more and less than $1 \times 10^{21}$ cm$^{-3}$. The first upper layer is provided on the first doped layer. The first upper layer includes a nitride semiconductor. The first upper layer has a lattice constant larger than or equal to the lattice constant of the first doped layer and larger than the lattice constant of the first lower layer.

According to another embodiment, a method is disclosed for growing a nitride semiconductor crystal. The method can include forming a lower strain relaxation layer including a nitride semiconductor on a major surface of a silicon substrate. The lower strain relaxation layer has a first lattice constant. The method can include forming an intermediate layer. The intermediate layer is formed by forming a first lower layer on the lower strain relaxation layer, forming a first doped layer on the first lower layer, and forming a first upper layer on the first doped layer. The first lower layer includes a nitride semiconductor. The first lower layer has a second lattice constant larger than the first lattice constant. The first doped layer includes a nitride semiconductor. The first doped layer has a third lattice constant larger than or equal to the second lattice constant and containing an impurity at a concentration of $1 \times 10^{18}$ cm$^{-3}$ or more and less than $1 \times 10^{21}$ cm$^{-3}$. The first upper layer includes a nitride semiconductor. The first upper layer has a fourth lattice constant larger than or equal to the third lattice constant and larger than the second lattice constant. The method can include forming an upper strain relaxation layer including a nitride semiconductor on the intermediate layer. In addition, the method can include forming a functional layer including a nitride semiconductor on the upper strain relaxation layer.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

The first embodiment relates to a nitride semiconductor wafer. In the nitride semiconductor wafer, for instance, at least part of a semiconductor device, or a portion constituting at least part of a semiconductor device, is provided. This semiconductor device includes e.g. a semiconductor light emitting device, a semiconductor light receiving device, and an electronic device. The semiconductor light emitting device includes e.g. a light emitting diode (LED) and a laser diode (LD). The semiconductor light receiving device includes e.g. a photodiode (PD). The electronic device includes e.g. a high electron mobility transistor (HEMT), a heterojunction bipolar transistor (HBT), a field effect transistor (FET), and a Schottky barrier diode (SBD).

FIG. 1 is a schematic sectional view illustrating the configuration of a nitride semiconductor wafer according to the first embodiment.

As shown in FIG. 1, the nitride semiconductor wafer 110 according to the embodiment includes a silicon substrate 50, a lower strain relaxation layer 51, an intermediate layer 55, an upper strain relaxation layer 52, and a functional layer 40.

The silicon substrate 50 has a major surface 50a. The silicon substrate 50 is e.g. a Si (111) substrate. However, the embodiment is not limited thereto. The surface orientation of the silicon substrate 50 is arbitrary.

The lower strain relaxation layer 51 is provided on the major surface 50a of the silicon substrate 50. The lower strain relaxation layer 51 includes a nitride semiconductor. The lower strain relaxation layer 51 is made of e.g. AlN. More specifically, the lower strain relaxation layer 51 is a low temperature grown AlN layer. The lower strain relaxation layer 51 can function as a nucleation layer provided on the major surface 50a of the silicon substrate 50. The thickness of the lower strain relaxation layer 51 is e.g. 10 nanometers (nm) or more and 200 nm or less. The lower strain relaxation layer 51 has a first lattice constant.

The intermediate layer 55 is provided on the lower strain relaxation layer 51. The intermediate layer 55 includes a nitride semiconductor.

The upper strain relaxation layer 52 is provided on the intermediate layer 55. The upper strain relaxation layer 52 includes a nitride semiconductor. The upper strain relaxation layer 52 is made of e.g. $Al_{z0}Ga_{1-z0}N$ ($0<z0\leq1$). The upper strain relaxation layer 52 is made of e.g. AlN or AlGaN.

The functional layer 40 is provided on the upper strain relaxation layer 52. The functional layer 40 includes a nitride semiconductor. The functional layer 40 includes e.g. a layer having the light emitting function of a semiconductor light emitting device. The functional layer 40 includes e.g. a layer having the light receiving function of a semiconductor light receiving device. The functional layer 40 includes e.g. a layer having at least one function of rectification, switching, and amplification of an electronic device. An example configuration of the functional layer 40 is described later.

The intermediate layer 55 includes a first lower layer LA1, a first doped layer LB1, and a first upper layer LC1. The first lower layer LA1 is provided on the lower strain relaxation layer 51. The first lower layer LA1 includes a nitride semiconductor. The nitride semiconductor included in the first lower layer LA1 has a lattice constant (a second lattice constant) larger than the lattice constant (the first lattice constant) of the nitride semiconductor of the lower strain relaxation layer 51.

In the description, it is assumed that the "lattice constant" refers to the lattice constant along a-axis direction.

The first doped layer LB1 is provided on the first lower layer LA1. The first doped layer LB1 includes a nitride semiconductor. The nitride semiconductor included in the first doped layer LB1 has a lattice constant (a second lattice constant) larger than or equal to the lattice constant of the first lower layer LA1. The first doped layer LB1 contains impurity at a concentration of $1\times10^{18}$ cm$^{-3}$ or more and less than $1\times10^{21}$ cm$^{-3}$.

The first upper layer LC1 is provided on the first doped layer LB1. The first upper layer LC1 includes a nitride semiconductor. The nitride semiconductor included in the first upper layer LC1 has a lattice constant (a fourth lattice constant) larger than or equal to the lattice constant of the nitride semiconductor of the first doped layer LB1 and larger than the lattice constant of the nitride semiconductor of the first lower layer LA1.

The intermediate layer 55 includes a first stacked film SL1. The first stacked film SL1 includes the first lower layer LA1, the first doped layer LB1, and the first upper layer LC1 described above. However, as described later, the intermediate layer 55 may be configured to include a plurality of stacked films.

Here, the direction from the first lower layer LA1 toward the first upper layer LC1 is defined as stacking direction (Z-axis direction). The stacking direction is parallel to the direction from the silicon substrate 50 toward the functional layer 40.

In the first stacked film SL1, toward the stacking direction (in the direction from the first lower layer LA1 toward the first upper layer LC1), the lattice constant increases. The lattice constant of the first lower layer LA1 is denoted by a1. The lattice constant of the first doped layer LB1 is denoted by b1. The lattice constant of the first upper layer LC1 is denoted by c1. Then, a1<c1. Furthermore, a1<b1<c1 or a1≤b1<c1 or a1<b1≤c1.

For instance, the first lower layer LA1 includes $Al_{xa1}In_{ya1}Ga_{1-xa1-ya1}N$ ($0\leq xa1<1$, $0\leq ya1<1$, $xa1+ya1\leq1$). The first doped layer LB1 includes $Al_{xb1}In_{yb1}Ga_{1-xb1-yb1}N$ ($0\leq xb1<1$, $0\leq yb1<1$, $xb1+yb1\leq1$). The first upper layer LC1 includes $Al_{xc1}In_{yc1}Ga_{1-xc1-yc1}N$ ($0\leq xc1<1$, $0\leq yc1<1$, $xc1+yc1\leq1$).

For instance, the first lower layer LA1 includes $Al_{xa1}Ga_{1-xa1}N$ ($0<xa1\leq1$). The first doped layer LB1 includes $Al_{xb1}Ga_{1-xb1}N$ ($0<xb1<xa1$). The first upper layer LC1 includes $Al_{xc1}Ga_{1-xc1}N$ ($0\leq xc1<xb1$).

For instance, the composition ratio of the first doped layer LB1 is different from the composition ratio of the first lower layer LA1, and also different from the composition ratio of the first upper layer LC1. The lattice constant of the first doped layer LB1 is larger than the lattice constant of the first lower layer LA1, and smaller than the lattice constant of the first upper layer LC1.

The first lower layer LA1 is e.g. an $Al_{0.5}Ga_{0.5}N$ layer. The first doped layer LB1 is e.g. an $Al_{0.2}Ga_{0.8}N$ layer. The first upper layer LC1 is e.g. a GaN layer.

The thickness of the first lower layer LA1 is e.g. 100 nm or more and 500 nm or less. The thickness of the first doped layer LB1 is e.g. 20 nm or more and 150 nm or less. The thickness of the first upper layer LC1 is e.g. 100 nm or more and 500 nm or less.

The impurity contained in the first doped layer LB1 includes e.g. at least one of silicon (Si) and magnesium (Mg). Furthermore, the impurity can include e.g. at least one of Si, Mg, manganese (Mn), iron (Fe), oxygen (O), and carbon (C).

Thus, in the nitride semiconductor wafer 110 according to the embodiment, the intermediate layer 55 includes a stacked film (e.g., first stacked film SL1). In the first stacked film SL1, the lattice constant increases along the stacking direction. Thus, in the first stacked film SL1, a compressive strain is applied. This suppresses cracks. In the first stacked film SL1, the compressive strain increases toward the stacking direction.

Furthermore, in the first stacked film SL1, the first doped layer LB1 doped with impurity is placed between the first lower layer LA1 having a small lattice constant and the first upper layer LC1 having a large lattice constant. This reduces dislocations.

The embodiment can provide a nitride semiconductor wafer formed on a silicon substrate and having few dislocations and cracks. That is, the dislocation density and crack density are simultaneously reduced.

Figure 2:
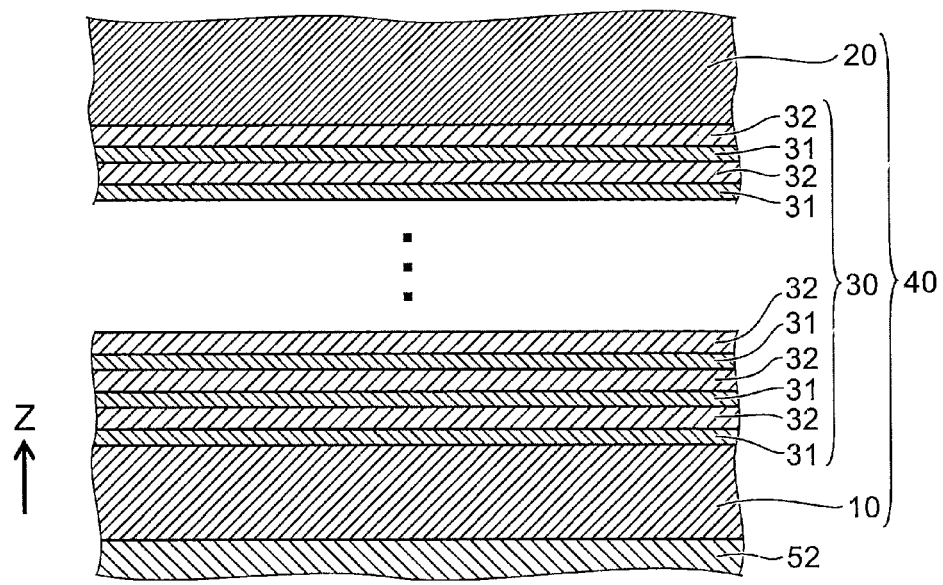
FIG. 2 is a schematic sectional view illustrating a part of the nitride semiconductor wafer according to the first embodiment.

FIG. 2 is a schematic sectional view illustrating the configuration of part of the nitride semiconductor wafer according to the first embodiment.

FIG. 2 illustrates the configuration of the functional layer 40 in the case where the nitride semiconductor wafer 110 is applied to a semiconductor light emitting device.

As shown in FIG. 2, in this example, the functional layer 40 includes a first semiconductor layer 10, a second semiconductor layer 20, and a light emitting section 30. The first semiconductor layer 10 is provided on the upper strain relaxation layer 52. The first semiconductor layer 10 includes a nitride semiconductor, and has a first conductivity type. The second semiconductor layer 20 is provided on the first semiconductor layer 10. The second semiconductor layer 20 includes a nitride semiconductor, and has a second conductivity type different from the first conductivity type. For instance, the first conductivity type is n-type, and the second conductivity type is p-type. Alternatively, the first conductivity type may be p-type, and the second conductivity type may be n-type.

The light emitting section 30 is provided between the first semiconductor layer 10 and the second semiconductor layer 20. The light emitting section 30 includes a plurality of barrier layers 31 and a well layer 32 provided between the plurality of barrier layers 31. The number of well layers 32 may be one, or a plurality. That is, the light emitting section 30 can have an SQW (single-quantum well) structure, or an MQW (multi-quantum well) structure.

The bandgap energy of the barrier layer 31 is larger than the bandgap energy of the well layer 32. The well layer 32 is made of e.g. InGaN. The barrier layer 31 is made of GaN. In the case where the barrier layer 31 is made of InGaN, the In composition ratio in the barrier layer 31 is smaller than the In composition ratio in the well layer 32. The peak wavelength of light emitted from the light emitting section 30 is e.g. 200 nm or more and 1300 nm or less.

In the description, "the state in which a second layer is provided on a first layer" includes not only the state in which the second layer is provided in contact with the first layer on the first layer, but also the state in which a third layer is interposed on the first layer and the second layer is placed on the third layer.

The nitride semiconductor wafer 110 is fabricated as follows, for instance. On the major surface 50a of a silicon substrate 50, a lower strain relaxation layer 51 is formed. A first lower layer LA1 is formed thereon. A first doped layer LB1 is formed thereon. A first upper layer LC1 is formed thereon. Furthermore, an upper strain relaxation layer 52 is formed thereon. A functional layer 40 is formed thereon.

Specifically, on the major surface 50a of a silicon substrate 50, the following crystal layers are formed by e.g. the MOVPE method. First, a low temperature grown AlN layer constituting a lower strain relaxation layer 51 is formed. The formation temperature of the lower strain relaxation layer 51 is e.g. 900° C. or less. The formation temperature of the lower strain relaxation layer 51 is e.g. approximately 700° C. The thickness of the lower strain relaxation layer 51 is e.g. 30 nm.

Further thereon, an $Al_{0.5}Ga_{0.5}N$ layer constituting a first lower layer LA1 is formed. The formation temperature of the first lower layer LA1 is e.g. 1100° C. The thickness of the first lower layer LA1 is e.g. approximately 300 nm.

Further thereon, an $Al_{0.2}Ga_{0.8}N$ layer constituting a first doped layer LB1 is formed. The formation temperature of the first doped layer LB1 is e.g. approximately 1100° C. The first doped layer LB1 is doped with e.g. Mg at a high concentration. The concentration of Mg in the first doped layer LB1 is $1 \times 10^{18}$ cm$^{-3}$ or more and less than $1 \times 10^{21}$ cm$^{-3}$.

Further thereon, a GaN layer constituting a first upper layer LC1 is formed. The formation temperature of the first upper layer LC1 is e.g. 1120° C. The thickness of the first upper layer LC1 is e.g. 600 nm.

Further thereon, a low temperature grown AlN layer constituting an upper strain relaxation layer 52 is formed. Alternatively, the upper strain relaxation layer 52 may be a low temperature grown AlGaN layer. The formation temperature of the upper strain relaxation layer 52 is e.g. 900° C. or less. The formation temperature of the upper strain relaxation layer 52 is e.g. approximately 700° C. The thickness of the upper strain relaxation layer 52 is e.g. 15 nm.

Furthermore, on the upper strain relaxation layer 52, an n-type GaN layer constituting a first semiconductor layer 10 is formed. The formation temperature of the first semiconductor layer 10 is e.g. 1100° C. The first semiconductor layer 10 is doped with e.g. Si. The thickness of the first semiconductor layer 10 is e.g. 2 micrometers (μm). Further thereon, an $In_{0.15}Ga_{0.85}N$ layer constituting a well layer 32 and a GaN layer constituting a barrier layer 31 are stacked at e.g. 750° C. to form a light emitting section 30. Further thereon, a p-type GaN layer constituting a second semiconductor layer 20 is formed. The second semiconductor layer 20 is doped with Mg. The formation temperature of the second semiconductor layer 20 is e.g. 950° C.

Thus, the nitride semiconductor wafer 110 according to the embodiment is formed. Furthermore, subsequently, a p-side electrode and an n-side electrode are formed, and then individual devices are divided. Thus, a semiconductor light emitting device is formed.

In the nitride semiconductor wafer according to the embodiment, in the stacked film (e.g., first stacked film SL1) of the intermediate layer 55, the lattice constant increases along the stacking direction. Thus, in the first stacked film SL1, a compressive strain is applied. This suppresses cracks. Furthermore, the stress of the wafer is reduced. Moreover, the first stacked film SL1 includes a first doped layer LB1. This allows three-dimensional crystal growth, and hence reduces dislocations. For instance, the first doped layer LB1 provided in the first stacked film SL1 enlarges texture of the surface of the first doped layer LB1 and the first upper layer LC1 formed thereon. This reduces dislocations when planarized again.

The embodiment can provide a nitride semiconductor wafer formed on a silicon substrate and having few dislocations and cracks. That is, the dislocation density and crack density are simultaneously reduced.

As a substrate for forming a nitride semiconductor device, a sapphire substrate is often used. Furthermore, use of a silicon carbide substrate or silicon substrate is under investigation. The silicon substrate is easier to divide or cut than the sapphire substrate and silicon carbide substrate. Furthermore, the cost of the silicon substrate is lower. Furthermore, the silicon substrate can be made conductive, and served as a current path. However, the difference in lattice constant between the silicon substrate and a nitride semiconductor is large. Hence, a nitride semiconductor formed on the silicon substrate is likely to have higher dislocation density than that formed on the sapphire substrate. Furthermore, the thermal expansion coefficient difference between the silicon substrate and a nitride semiconductor is large. Hence, cracks are likely to occur.

In this context, there is a configuration (first reference example) in which first layers containing impurity and second layers not containing impurity are alternately stacked on a silicon substrate. In this configuration, the composition of the second layer is identical to the composition of the first layer. In this case, because the first layer and the second layer are identical in composition, the lattice constant in these layers is also equal. Thus, these layers generate no compressive stress. In the first reference example, between the silicon substrate and the nitride semiconductor layer, due to the large thermal expansion coefficient difference, cracks are likely to occur in the nitride semiconductor layer when the temperature is decreased from the growth temperature to room temperature.

There is another configuration (second reference example) in which a nucleation layer, an Al composition gradient layer, a first nitride semiconductor layer, a strain relaxation intermediate layer, and a second nitride semiconductor layer are stacked in this order on a silicon substrate, and a SiN layer or a MgN layer is placed between the first nitride semiconductor layer and the strain relaxation intermediate layer. This configuration intends to reduce dislocations in the second nitride semiconductor layer by the mask effect.

However, according to experiments by the inventor, if the first doped layer LB1 of the intermediate layer 55 is doped with Si or Mg at a concentration higher than a certain level, SiN or MgN is likely to be formed. If a SiN layer or MgN layer is formed, it is difficult to sufficiently reduce dislocations.

In the first doped layer LB1, the site of the Group III element of the Group III nitride semiconductor crystal is replaced by an impurity, and the impurity occupies the lattice site. Then, the lattice structure is maintained, and no discontinuous portion occurs in the crystal. If a discontinuous portion occurs in the crystal, a new dislocation or defect may occur therefrom. When the impurity concentration of e.g. Si and Mg is high, the impurity does not occupy the lattice site, but appear at an interstitial site. The impurity may be directly bonded to a nitrogen atom, and foreign matter such as Si—N or Mg—N may occur in the crystal. By setting the impurity concentration to less than $1\times10^{21}$ cm$^{-3}$, occurrence of foreign matter in the crystal can be suppressed.

In the embodiment, the impurity concentration in the first doped layer LB1 is $1\times10^{18}$ cm$^{-3}$ or more and less than $1\times10^{21}$ cm$^{-3}$. In the first doped layer LB1, the doped impurity element (e.g., at least one of Si, Mg, Mn, Fe, O, and C) is placed at a lattice site of the nitride semiconductor of the first doped layer LB1. The impurity element is introduced just enough to replace the element occupying the lattice site. For instance, the introduced impurity forms no compounds such as SiN or MgN.

By the doped impurity, the crystal grows three-dimensionally in the first doped layer LB1 (and the first upper layer LC1 formed thereon), and the surface texture is enlarged. This reduces the density of dislocations (edge dislocations and screw dislocations).

FIGS. 3A to 3D are atomic force micrographs illustrating the configuration of part of the nitride semiconductor wafer.

These figures show example results of the experiment performed by the inventor. FIGS. 3A to 3D correspond to first to fourth samples S01-S04, respectively. The first sample S01 is a sample in which the first doped layer LB1 is not formed. The second sample S02 represents a sample in which the first doped layer LB1 is formed with Si introduced at $8.9\times10^{-3}$ μmol/min. The concentration of Si in the second sample S02 is equivalent to $4\times10^{19}$ cm$^{-3}$. The third sample S03 represents a sample in which the first doped layer LB1 is formed with Si introduced at $8.9\times10^{-2}$ μmol/min. The concentration of Si in the third sample S03 is equivalent to $4\times10^{20}$ cm$^{-3}$. The fourth sample S04 represents a sample in which the first doped layer LB1 is formed with Mg introduced at $5.8\times10^{-1}$ μmol/min. The concentration of Mg in the fourth sample S04 is equivalent to $5\times10^{18}$ cm$^{-3}$. FIGS. 3A to 3D illustrate the first to fourth samples S01-S04 in which the upper surface of the first upper layer LC1 (in this example, GaN layer) is observed by an atomic force microscope (AFM).

Figures 3A, 3B:
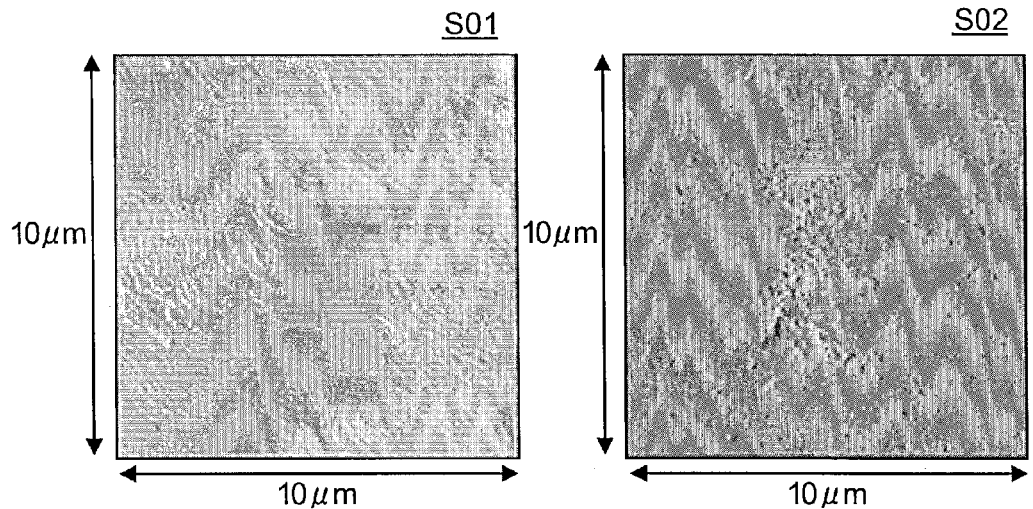
FIGS. 3A to 3D are atomic force micrographs illustrating a part of the nitride semiconductor wafer.

As shown in FIG. 3A, in the first sample S01 not provided with the first doped layer LB1, the surface is flat. The surface roughness Ra (arithmetic mean roughness) is 0.34 nm.

As shown in FIG. 3B, in the second sample S02, texture is formed at the surface of the first upper layer LC1 (in this example, GaN layer). That is, the GaN layer is formed in an island shape. The surface roughness Ra in the second sample S02 is 3.77 nm.

Figures 3C, 3D:
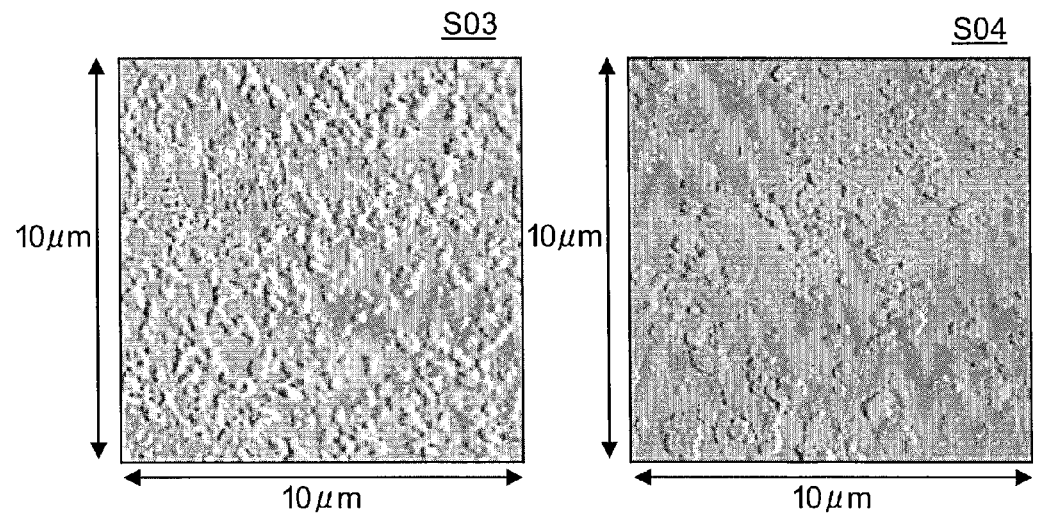

As shown in FIG. 3C, in the third sample S03 with high Si concentration, island formation of the GaN layer is further promoted. The surface roughness Ra in the third sample S03 is 38.7 nm. Thus, by increasing the impurity concentration in the first doped layer LB1, island formation of the GaN layer is promoted, and the height of the surface unevenness of the GaN layer is significantly increased.

As shown in FIG. 3D, also in the fourth sample S04 doped with Mg, the GaN layer is formed in an island shape, and texture is formed at the surface of the GaN layer. The surface roughness Ra in the fourth sample S04 is 13.2 nm.

Thus, by providing a first doped layer LB1 doped with impurity, texture is formed at the surface of the first upper layer LC1 formed thereon, and a three-dimensional island-like crystal is obtained. By the formation of texture at the surface, the dislocation formed proceeds along the lateral direction (the direction having a component perpendicular to the Z-axis direction) and links to e.g. another dislocation. This reduces the density of dislocations extending in the Z-axis direction.

Depending on the kind of impurity doped in the first doped layer LB1, the influence on the island-like surface of the first upper layer LC1 on the first doped layer LB1 is varied. Furthermore, the sizes of the islands are affected also by the growth condition. However, the impurity concentration achieving the effect of reducing the dislocation density is generally in the range of $1\times10^{18}$ cm$^{-3}$ or more and less than $1\times10^{21}$ cm$^{-3}$.

Figure 4A:
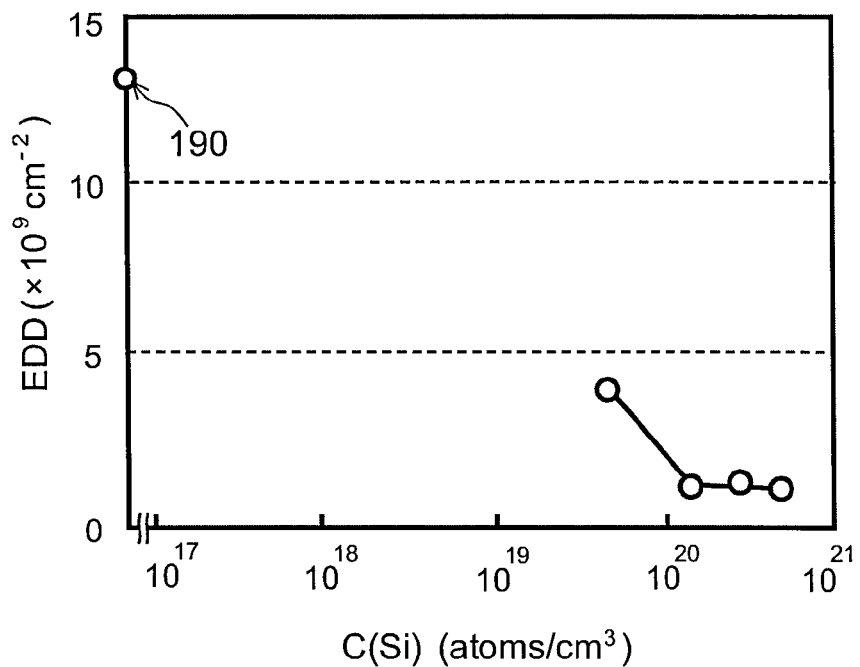
FIGS. 4A and 4B are graphs illustrating the characteristics of the nitride semiconductor wafer.
Figure 4B:
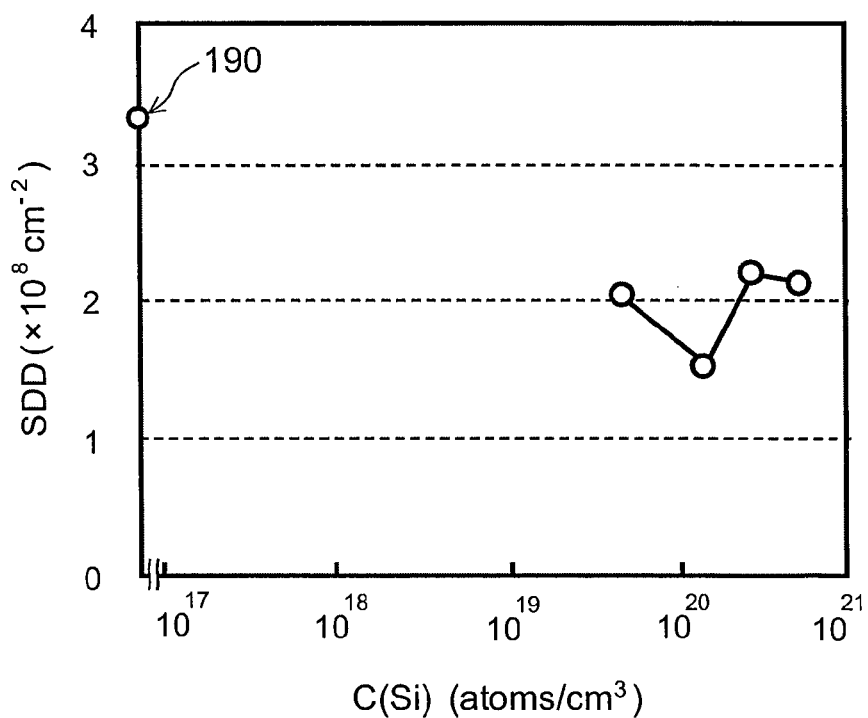

FIGS. 4A and 4B are graphs illustrating the characteristics of the nitride semiconductor wafer.

These figures show the relationship between Si concentration and dislocation density in the case where Si is used as the impurity doped in the first doped layer LB1. FIGS. 4A and 4B also shows the characteristics of a semiconductor light emitting device 190 of a reference example not provided with the first doped layer LB1. The vertical axis of FIG. 4A represents edge dislocation density (EDD). The vertical axis of FIG. 4B represents screw dislocation density (SDD). The horizontal axis of these figures represents impurity concentration C(Si) in the first doped layer LB1.

As shown in FIG. 4A, in the semiconductor light emitting device 190 not provided with the first doped layer LB1, the edge dislocation density (EDD) is as high as approximately $1.3\times10^{10}$ cm$^{-2}$. In contrast, in the case of providing a first doped layer LB1 doped with Si (in this example, the impurity concentration C(Si) is $4\times10^{19}$-$4\times10^{20}$/cm$^3$), the edge dislocation density (EDD) is significantly decreased to the range of approximately $1.3\times10^9$ cm$^{-2}$ to approximately $4.1\times10^9$ cm$^{-2}$.

On the other hand, as shown in FIG. 4B, in the semiconductor light emitting device 190 not provided with the first doped layer LB1, the screw dislocation density (SDD) is as high as approximately $3.3\times10^8$ cm$^{-2}$. In contrast, in the case of providing a first doped layer LB1 doped with Si, the screw dislocation density (SDD) is significantly decreased to the range of approximately $1.5\times10^8$ cm$^{-2}$ to approximately $2.1\times10^8$ cm$^{-2}$.

Figure 5A:
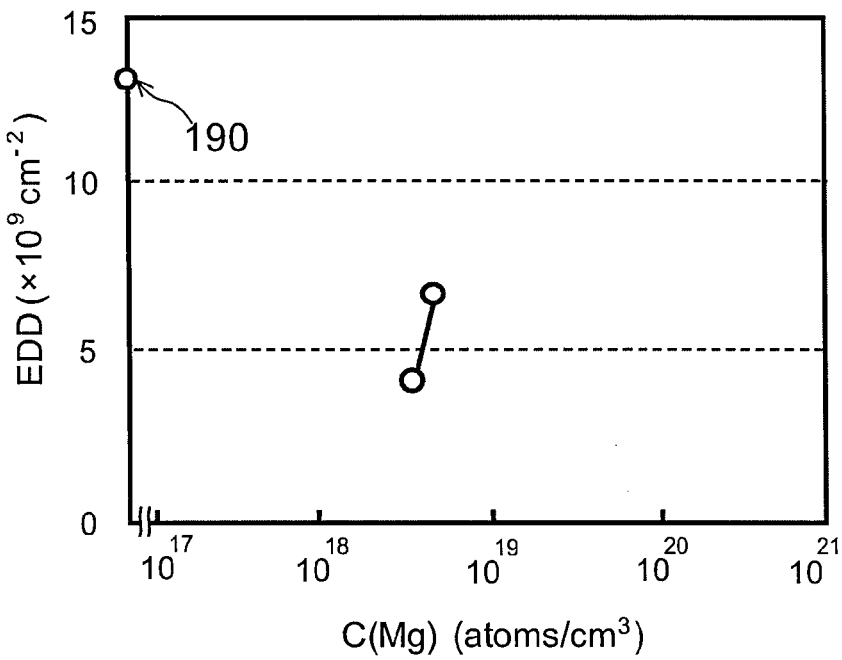
FIGS. 5A and 5B are graphs illustrating the characteristics of the nitride semiconductor wafer.
Figure 5B:
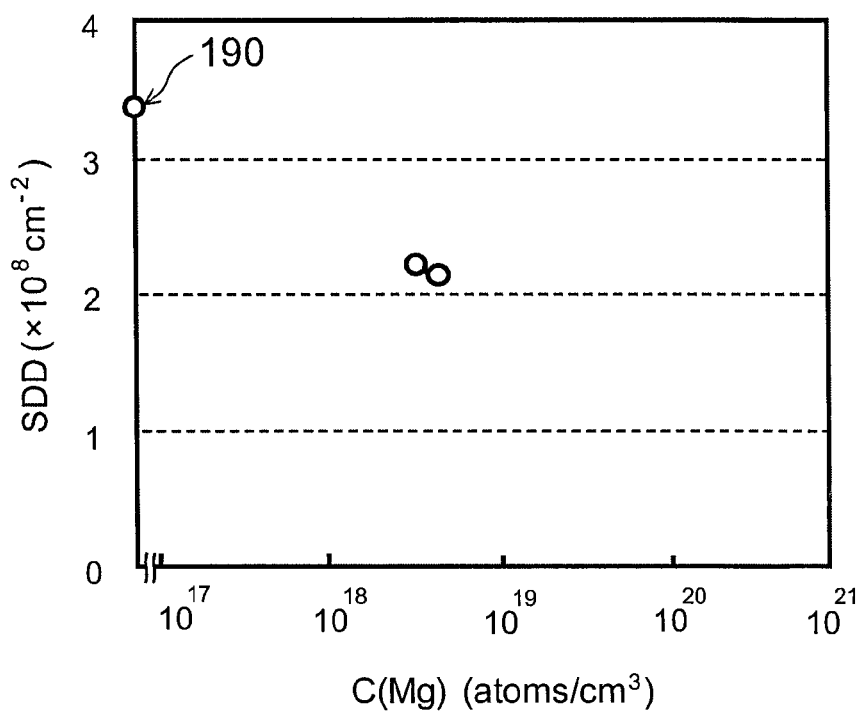

FIGS. 5A and 5B are graphs illustrating the characteristics of the nitride semiconductor wafer.

These figures show the relationship between Mg concentration and dislocation density in the case where Mg is used as the impurity doped in the first doped layer LB1. The vertical axis of FIG. 5A represents edge dislocation density (EDD). The vertical axis of FIG. 5B represents screw dislocation density (SDD). The horizontal axis of these figures represents impurity concentration C(Mg) in the first doped layer LB1.

As shown in FIG. 5A, the edge dislocation density (EDD) of the semiconductor light emitting device 190 is approximately $1.3\times10^{10}$ cm$^{-2}$. In contrast, in the case of providing a first doped layer LB1 doped with Mg (in this example, the impurity concentration C(Mg) is $1.4\times10^{18}$-$2.8\times10^{18}$/cm$^3$), the edge dislocation density (EDD) is significantly decreased to the range of approximately $4.2\times10^9$ cm$^{-2}$ to approximately $6.8\times10^9$ cm$^{-2}$.

As shown in FIG. 5B, the screw dislocation density (SDD) of the semiconductor light emitting device 190 is approximately $3.3\times10^8$ cm$^{-2}$. In contrast, in the case of providing a first doped layer LB1 doped with Mg, the screw dislocation density SDD is significantly decreased to approximately $2.1\times10^8$ cm$^{-2}$.

In the embodiment, in forming the first doped layer LB1, elements such as Si and Mg are introduced as impurity into the first doped layer LB1. To this end, a source gas of impurity such as Si and Mg is introduced into the reaction chamber in combination with the gas serving as source of the nitride semiconductor. For instance, an impurity is introduced in combination with the Group III source gas and Group V source gas to form the AlGaN layer (e.g., $Al_{xb1}In_{yb1}Ga_{1-xb1-yb1}N$ layer) constituting the first doped layer LB1. Thus, the impurity element is introduced as impurity into the nitride semiconductor. On the other hand, in the case of introducing e.g. a source containing nitrogen and source containing an impurity element without introducing e.g. source containing Ga, compounds such as SiN or MgN are formed.

Figure 6A:
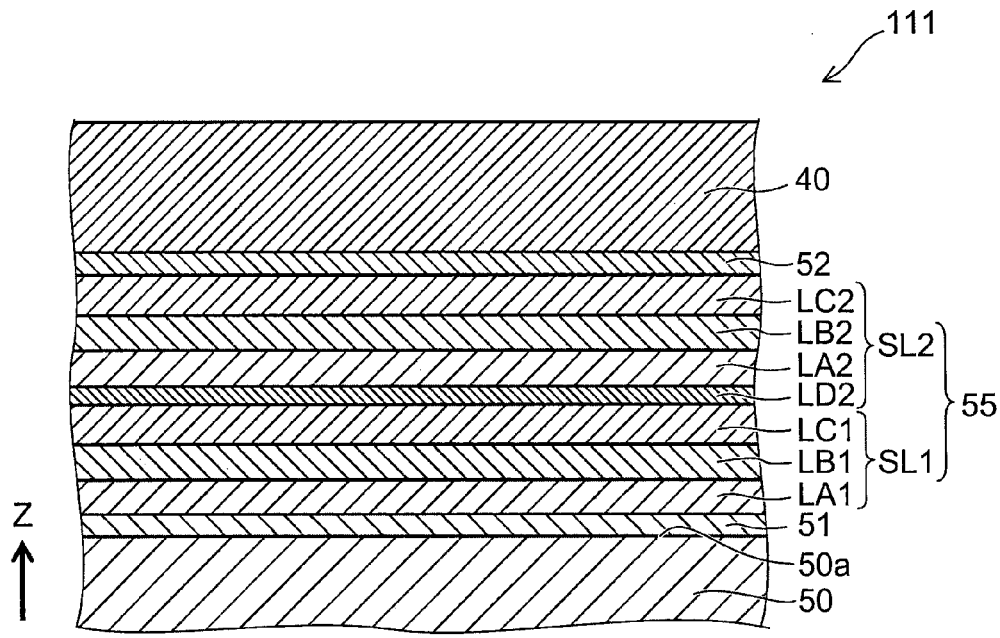
FIGS. 6A and 6B are schematic sectional views illustrating alternative nitride semiconductor wafers according to the first embodiment.
Figure 6B:
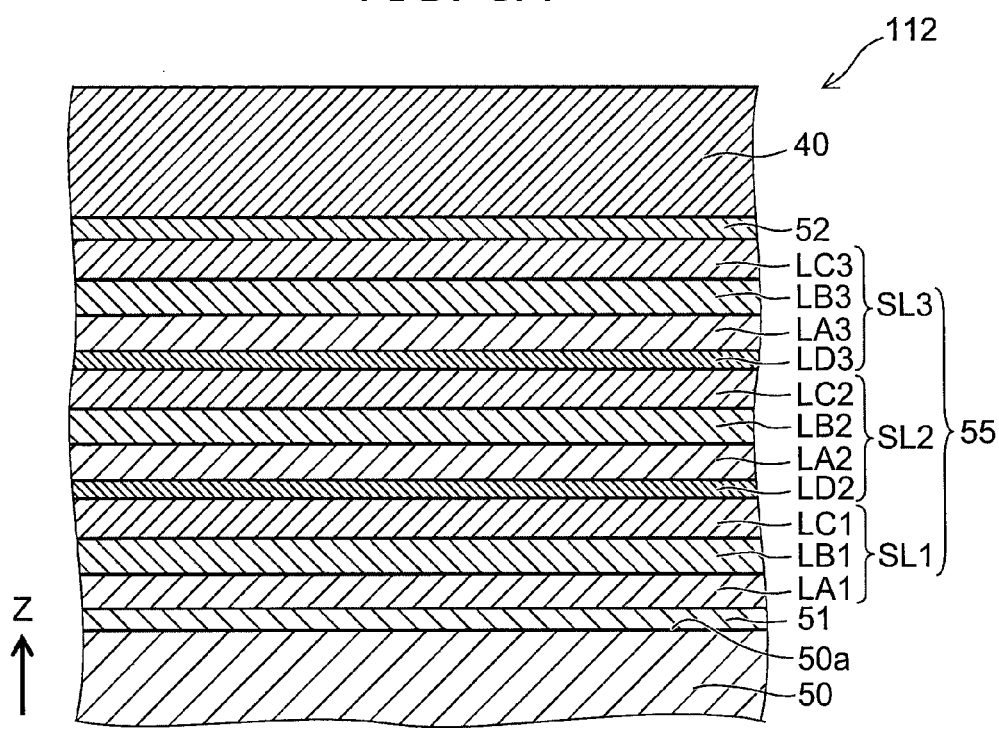

FIGS. 6A and 6B are schematic sectional views illustrating the configuration of alternative nitride semiconductor wafers according to the first embodiment.

As shown in FIG. 6A, in the alternative nitride semiconductor wafer 111 according to the embodiment, the intermediate layer 55 further includes a second lower layer LA2, a second doped layer LB2, and a second upper layer LC2. The second lower layer LA2 is provided on the first upper layer LC1. The second lower layer includes a nitride semiconductor having a lattice constant (a fifth lattice constant) smaller than the lattice constant of the first upper layer LC1. The second doped layer LB2 is provided on the second lower layer LA2. The second doped layer LB2 includes a nitride semiconductor. The nitride semiconductor included in the second doped layer LB2 has a lattice constant (a sixth lattice constant) larger than or equal to the lattice constant of the second lower layer LA2. The nitride semiconductor included in the second doped layer LB2 contains impurity at a concentration of $1\times10^{18}$ cm$^{-3}$ or more and less than $1\times10^{21}$ cm$^{-3}$. The second upper layer LC2 is provided on the second doped layer LB2. The second upper layer LC2 includes a nitride semiconductor. The nitride semiconductor layer included in the second upper layer LC2 has a lattice constant (a seventh lattice constant) larger than or equal to the lattice constant of the nitride semiconductor of the second doped layer LB2 and larger than the lattice constant of the nitride semiconductor of the second lower layer LA2.

Thus, the intermediate layer 55 further includes a second stacked film SL2 provided between the first stacked film SL1 and the upper strain relaxation layer 52. The second stacked film SL2 includes the second lower layer LA2, the second doped layer LB2, and the second upper layer LC2.

In this example, the intermediate layer 55 further includes a second strain relaxation layer LD2. That is, the second stacked film SL2 further includes a second strain relaxation layer LD2. The second strain relaxation layer LD2 is provided between the first upper layer LC1 and the second lower layer LA2. The second strain relaxation layer LD2 includes a nitride semiconductor having a lattice constant smaller than the lattice constant of the nitride semiconductor of the second lower layer LA2. The second strain relaxation layer LD2 is made of $Al_{z2}Ga_{1-z2}N$ ($0<z2\leq1$). The second strain relaxation layer LD2 is e.g. an AlN layer. For instance, in the case where the second strain relaxation layer LD2 includes AlGaN, the composition ratio of Al is higher than the composition ratio of Al in the second lower layer LA2. The second strain relaxation layer LD2 may be regarded as a portion of the second lower layer LA2 nearest to the silicon substrate 50.

For instance, the second lower layer LA2 includes $Al_{xa2}In_{ya2}Ga_{1-xa2-ya2}N$ ($0\leq xa2<1$, $0\leq ya2<1$, $xa2+ya2\leq1$). The second doped layer LB2 includes $Al_{xb2}In_{yb2}Ga_{1-xb2-yb2}N$ ($0\leq xb2<1$, $0\leq yb2<1$, $xb2+yb2\leq1$). The second upper layer LC2 includes $Al_{xc2}In_{yc2}Ga_{1-xc2-yc2}N$ ($0\leq xc2<1$, $0\leq yc2<1$, $xc2+yc2\leq1$).

For instance, the second lower layer LA2 includes $Al_{xa2}Ga_{1-xa2}N$ ($0<xa2\leq1$). The second doped layer LB2 includes $Al_{xb2}Ga_{1-xb2}N$ ($0<xb2<xa2$). The second upper layer LC2 includes $Al_{xc2}Ga_{1-xc2}N$ ($0\leq xc2<xb2$).

In the nitride semiconductor wafer 111, the first stacked film SL1 is configured so that the lattice constant increases along the stacking direction. In the first stacked film SL1, the applied stress is large in the uppermost first upper layer LC1. Furthermore, the second lower layer LA2 (or the second strain relaxation layer LD2) is provided on the uppermost first upper layer LC1 in the first stacked film SL1. In the second lower layer LA2 (or the second strain relaxation layer LD2), the stress is once released, and the strain is relieved. Then, the second stacked film SL2 is again configured so that the lattice constant increases along the stacking direction. Thus, each of a plurality of stacked films is configured so that the lattice constant increases along the stacking direction. This structure suppresses occurrence of cracks. Furthermore, the second doped layer LB2 is provided in the second stacked film SL2. This reduces the dislocation density.

As shown in FIG. 6B, in the alternative nitride semiconductor wafer 112 according to the embodiment, the intermediate layer 55 further includes a third stacked film SL3 (third lower layer LA3, third doped layer LB3, and third upper layer LC3). Also in this case, the intermediate layer 55 (third stacked film SL3) can further include a third strain relaxation layer LD3. The third strain relaxation layer LD3 is provided between the second upper layer LC2 and the third lower layer LA3. The third strain relaxation layer LD3 includes a nitride semiconductor having a lattice constant smaller than the lattice constant of the third lower layer LA3. The third strain relaxation layer LD3 may be regarded as a portion of the third lower layer LA3 nearest to the silicon substrate 50.

Figure 7A:
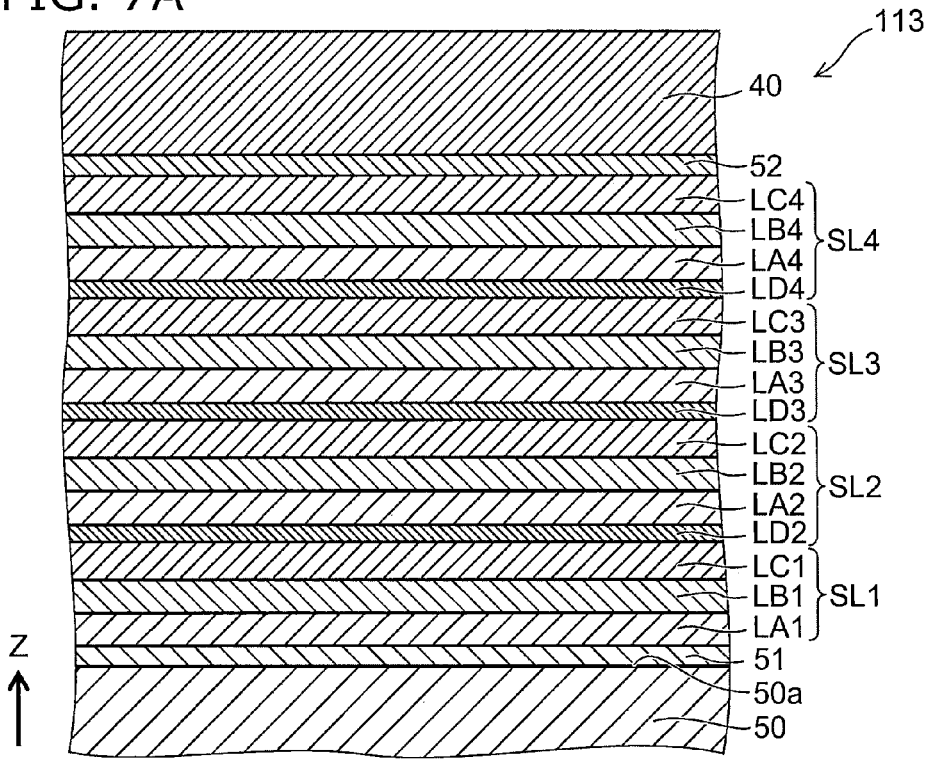
FIGS. 7A and 7B are schematic sectional views illustrating alternative nitride semiconductor wafers according to the first embodiment.
Figure 7B:
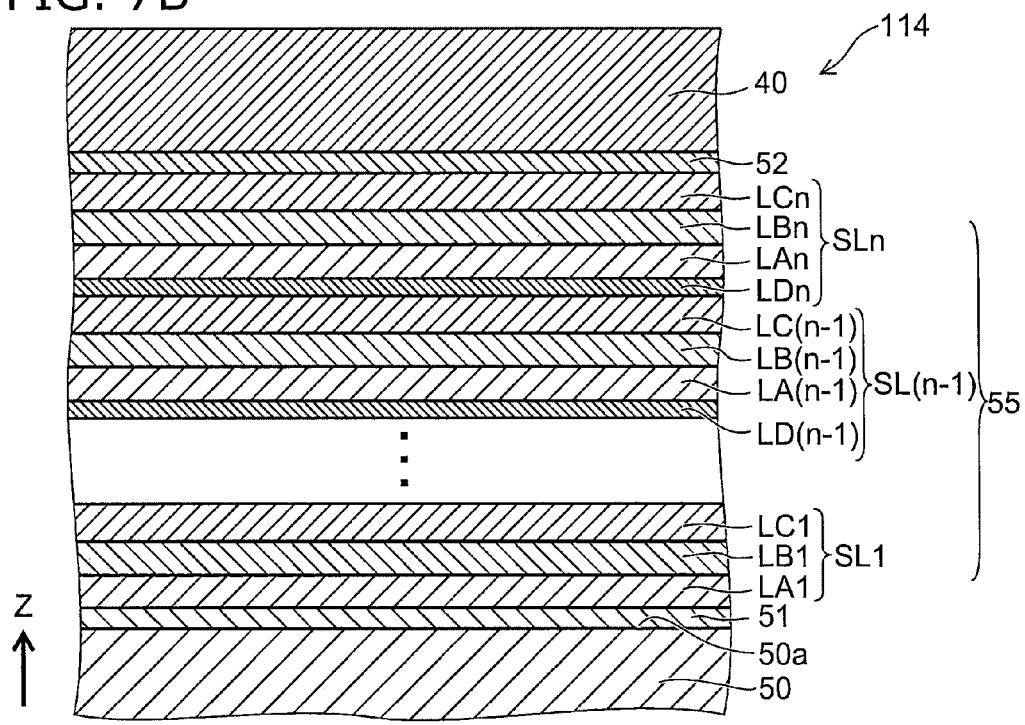

FIGS. 7A and 7B are schematic sectional views illustrating the configuration of alternative nitride semiconductor wafers according to the first embodiment.

As shown in FIG. 7A, in the alternative nitride semiconductor wafer 113 according to the embodiment, the intermediate layer 55 further includes a fourth stacked film SL4 (fourth lower layer LA4, fourth doped layer LB4, and fourth upper layer LC4). Also in this case, the intermediate layer 55 (fourth stacked film SL4) can further include a fourth strain relaxation layer LD4. The fourth strain relaxation layer LD4 is provided between the third upper layer LC3 and the fourth lower layer LA4. The fourth strain relaxation layer LD4 includes a nitride semiconductor having a lattice constant smaller than the lattice constant of the fourth lower layer LA4. The fourth strain relaxation layer LD4 may be regarded as a portion of the fourth lower layer LA4 nearest to the silicon substrate 50.

Thus, the intermediate layer 55 may include a plurality of stacked films (e.g., first to fourth stacked films SL1-SL4).

For instance, as shown in FIG. 7B, in the alternative nitride semiconductor wafer 114 according to the embodiment, the intermediate layer 55 can include first to n-th stacked films SL1-SLn (n is an integer of 2 or more). The n-th stacked film SLn includes an n-th lower layer LAn, an n-th doped layer LBn, and an n-th upper layer LCn. The n-th lower layer LAn is provided on the (n−1)-th upper layer LC(n−1). The n-th lower layer includes a nitride semiconductor having a lattice constant smaller than the lattice constant of the (n−1)-th upper layer LC(n−1). The n-th doped layer LBn is provided on the n-th lower layer LAn. The n-th doped layer LBn has a lattice constant larger than or equal to the lattice constant of the n-th lower layer LAn. The n-th doped layer LBn includes a nitride semiconductor containing impurity at a concentration of $1 \times 10^{18}$ cm$^{-3}$ or more and less than $1 \times 10^{21}$ cm$^{-3}$. The n-th upper layer LCn is provided on the n-th doped layer LBn. The n-th upper layer LCn includes a nitride semiconductor having a lattice constant larger than or equal to the lattice constant of the n-th doped layer LBn and larger than the lattice constant of the n-th lower layer LAn.

Thus, the intermediate layer 55 can further include an n-th stacked film SLn provided between the (n−1)-th stacked film SL(n−1) and the upper strain relaxation layer 52. The n-th stacked film SLn includes the n-th lower layer LAn, the n-th doped layer LBn, and the n-th upper layer LCn.

The intermediate layer 55 (n-th stacked film SLn) can further include an n-th strain relaxation layer LDn. The n-th strain relaxation layer LDn is provided between the (n−1)-th upper layer LC(n−1) and the n-th lower layer LAn. The n-th strain relaxation layer LDn includes a nitride semiconductor having a lattice constant smaller than the lattice constant of the n-th lower layer LAn. The n-th strain relaxation layer LDn is made of $Al_{zn}Ga_{1-zn}N$ (0<zn≤1). The n-th strain relaxation layer LDn is based on an AlN layer. In the case where the n-th strain relaxation layer LDn includes AlGaN, the composition ratio of Al is higher than e.g. the composition ratio of Al in the n-th lower layer LAn. The n-th strain relaxation layer LDn may be regarded as a portion of the n-th lower layer LAn nearest to the silicon substrate 50.

For instance, the n-th lower layer LAn includes $Al_{xan}In_{yan}Ga_{1-xan-yan}N$ (0≤xan<1, 0<yan≤1, xan+yan≤1). The n-th doped layer LBn includes $Al_{xbn}In_{ybn}Ga_{1-xbn-ybn}N$ (0≤xbn<1, 0≤ybn<1, xbn+ybn≤1). The n-th upper layer LCn includes $Al_{xcn}In_{ycn}Ga_{1-xcn-ycn}N$ (0≤xcn<1, 0≤ycn<1, xcn+ycn≤1).

For instance, the n-th lower layer LAn includes $Al_{xan}Ga_{1-xan}N$ (0<xan≤1). The n-th doped layer LBn includes $Al_{xbn}Ga_{1-xbn}N$ (0<xbn<xan). The n-th upper layer LCn includes $Al_{xcn}Ga_{1-xcn}N$ (0≤xcn<xbn).

In the nitride semiconductor wafer 114, the (n−1)-th stacked film SL(n−1) is configured so that the lattice constant increases along the stacking direction. In the (n−1)-th stacked film SL(n−1), the applied stress is large in the uppermost (n−1)-th upper layer LC(n−1). Furthermore, the n-th lower layer LAn (or the n-th strain relaxation layer LDn) is provided on the uppermost (n−1)-th upper layer LC(n−1) in the (n−1)-th stacked film SL(n−1). In the n-th lower layer LAn (or the n-th strain relaxation layer LDn), the stress is once released, and the strain is relieved. Then, the n-th stacked film SLn is again configured so that the lattice constant increases along the stacking direction. Thus, each of a plurality of stacked films is configured so that the lattice constant increases along the stacking direction. This suppresses occurrence of cracks. Furthermore, the n-th doped layer LBn is provided in the n-th stacked film SLn. This reduces the dislocation density.

Figure 8A:
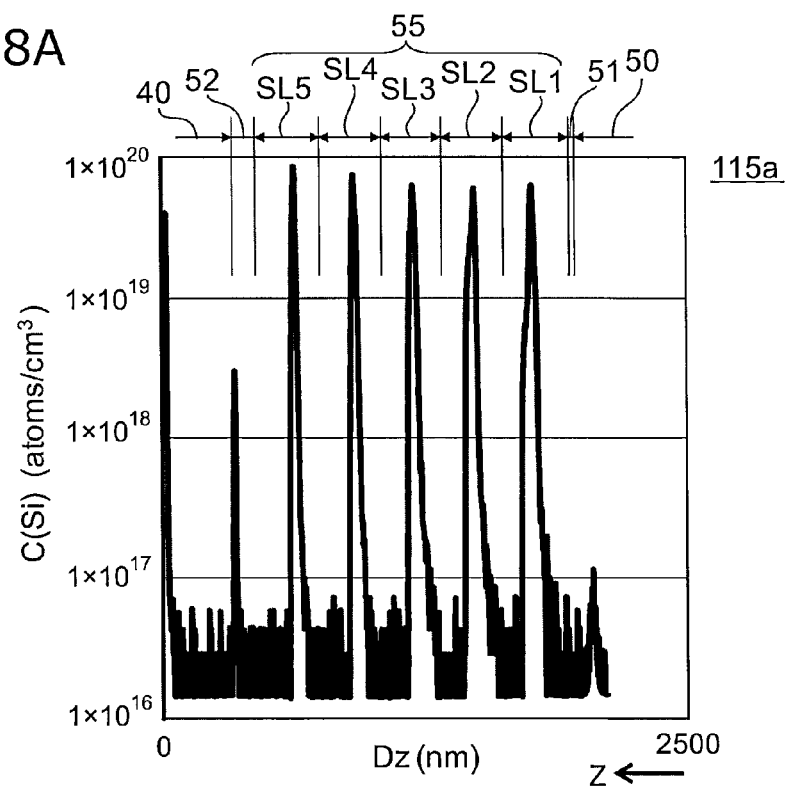
FIGS. 8A and 8B are graphs illustrating nitride semiconductor crystals according to the first embodiment.
Figure 8B:
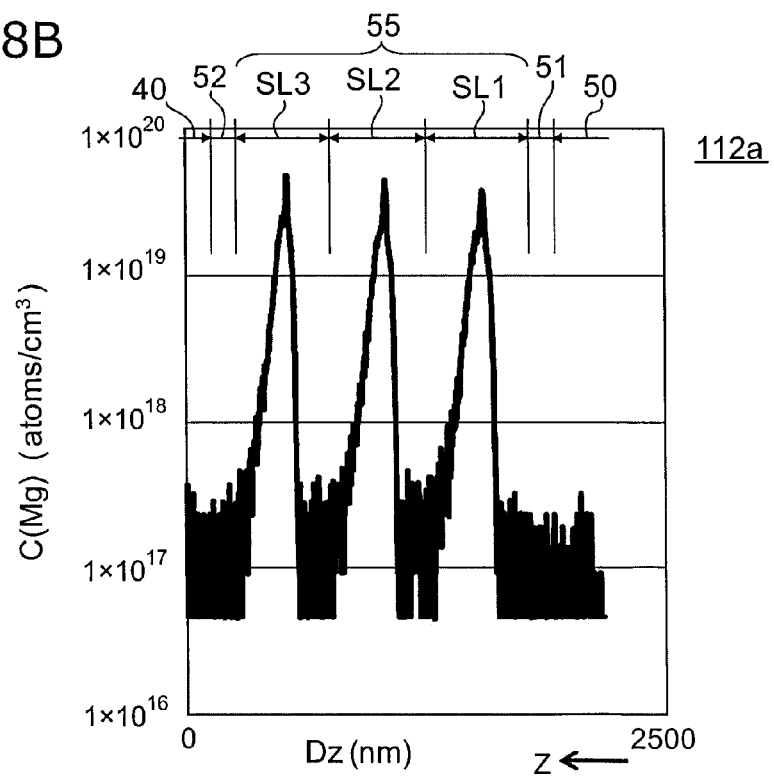

FIGS. 8A and 8B are graphs illustrating the configuration of nitride semiconductor crystals according to the first embodiment.

FIG. 8A shows an impurity concentration profile in a nitride semiconductor wafer 115a in which the intermediate layer 55 includes five stacked films (first to fifth stacked films SL1-SL5). In this example, the impurity in the doped layer is Si. The vertical axis of FIG. 8A represents Si impurity concentration C(Si). FIG. 8B shows an impurity concentration profile in a nitride semiconductor wafer 112a in which the intermediate layer 55 includes three stacked films (first to third stacked films SL1-SL3). In this example, the impurity in the doped layer is Mg. The vertical axis of FIG. 8B represents Mg impurity concentration C(Mg).

As shown in FIG. 8A, in the nitride semiconductor wafer 115a, the impurity concentration C(Si) in the doped layers (first to fifth doped layers LB1-LB5) of the intermediate layer 55 is approximately $6 \times 10^{19}$ cm$^{-3}$ or more and approximately $9 \times 10^{19}$ cm$^{-3}$ or less.

As shown in FIG. 8B, in the nitride semiconductor wafer 112a, the impurity concentration C(Mg) in the doped layers (first to third doped layers LB1-LB3) of the intermediate layer 55 is approximately $4 \times 10^{19}$ cm$^{-3}$ or more and approximately $6 \times 10^{19}$ cm$^{-3}$ or less.

The nitride semiconductor wafers 115a and 112a can provide a nitride semiconductor wafer formed on a silicon substrate and having few dislocations and cracks.

Second Embodiment

The embodiment relates to a method for growing a nitride semiconductor crystal. This growth method is applied to grow a nitride semiconductor crystal used for e.g. a semiconductor light emitting device, a semiconductor light receiving device, and an electronic device.

Figure 9:
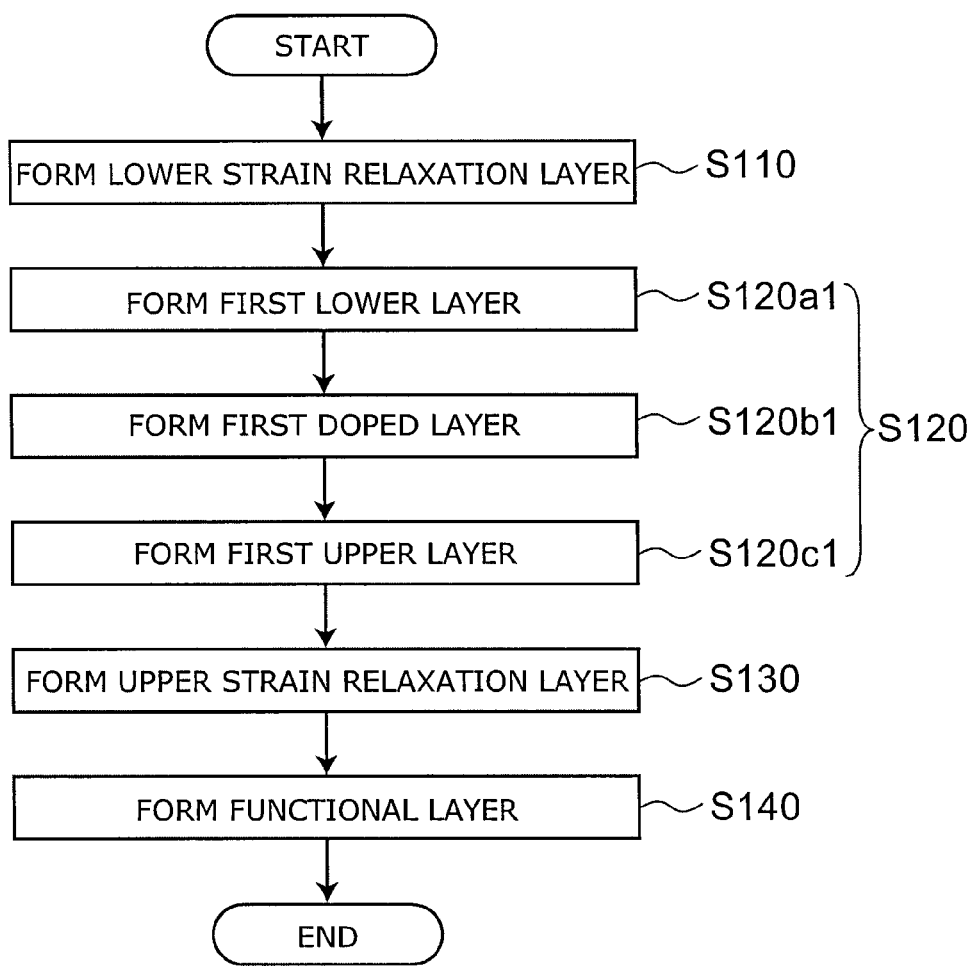
FIG. 9 is a flow chart illustrating the method for growing a nitride semiconductor crystal according to a second embodiment.

FIG. 9 is a flow chart illustrating the method for growing a nitride semiconductor crystal according to the second embodiment.

As shown in FIG. 9, in the method for growing a nitride semiconductor crystal according to the embodiment, a lower strain relaxation layer 51 is formed on the major surface 50a of a silicon substrate 50 (step S110).

Furthermore, an intermediate layer 55 is formed (step S120). The formation of the intermediate layer 55 includes forming a first lower layer LA1 on the lower strain relaxation layer 51 (step S120a1), forming a first doped layer LB1 on the first lower layer LA1 (step S120b1), and forming a first upper layer LC1 on the first doped layer LB1 (step S120c1). As described above, the first lower layer LA1 includes a nitride semiconductor having a lattice constant larger than the lattice constant of the lower strain relaxation layer. The first doped layer LB1 includes a nitride semiconductor having a lattice constant larger than or equal to the lattice constant of the first lower layer LA1, and containing impurity at a concentration of $1 \times 10^{18}$ cm$^{-3}$ or more and less than $1 \times 10^{21}$ cm$^{-3}$. The first upper layer LC1 includes a nitride semiconductor having a lattice constant larger than or equal to the lattice constant of the first doped layer LB1 and larger than the lattice constant of the first lower layer LA1. Thus, the formation of the intermediate layer 55 includes forming a first stacked film SL1.

Furthermore, in this growth method, an upper strain relaxation layer 52 including a nitride semiconductor layer is formed on the intermediate layer 55 (step S130). Furthermore, a functional layer 40 including a nitride semiconductor is formed on the upper strain relaxation layer 52.

The embodiment can provide a method for growing a nitride semiconductor crystal formed on a silicon substrate and having few dislocations and cracks. That is, the embodiment can provide a growth method in which the dislocation density and crack density are simultaneously reduced.

Also in the embodiment, the composition ratio of the first doped layer LB1 can be different from the composition ratio of the first lower layer LA1, and also different from the composition ratio of the first upper layer LC1. The lattice constant of the first doped layer LB1 is larger than the lattice constant of the first lower layer LA1, and smaller than the lattice constant of the first upper layer LC1.

For instance, the first lower layer LA1 includes $Al_{xa1}In_{ya1}Ga_{1-xa1-ya1}N$ ($0 \leq xa1 < 1$, $0 \leq ya1 < 1$, $xa1+ya1 \leq 1$). The first doped layer LB1 includes $Al_{xb1}In_{yb1}Ga_{1-xb1-yb1}N$ ($0 \leq xb1 < 1$, $0 \leq yb1 < 1$, $xb1+yb1 \leq 1$). The first upper layer LC1 includes $Al_{xc1}In_{yc1}Ga_{1-xc1-yc1}N$ ($0 \leq xc1 < 1$, $0 \leq yc1 < 1$, $xc1+yc1 \leq 1$).

For instance, the first lower layer LA1 includes $Al_{xa1}Ga_{1-xa1}N$ ($0 < xa1 \leq 1$). The first doped layer LB1 includes $Al_{xb1}Ga_{1-xb1}N$ ($0 < xb1 < xa1$). The first upper layer LC1 includes $Al_{xc1}Ga_{1-xc1}N$ ($0 \leq xc1 < xb1$).

The lower strain relaxation layer 51 is made of e.g. AlN. The upper strain relaxation layer is made of e.g. $Al_{z0}Ga_{1-z0}N$ ($0 < z0 \leq 1$).

The impurity contained in the first doped layer LB1 is e.g. at least one of Si, Mg, Mn, Fe, O, and C. The thickness of the first doped layer LB1 is 20 nm or more and 150 nm or less.

The formation of the intermediate layer 55 may include forming a plurality of stacked films.

Figure 10:
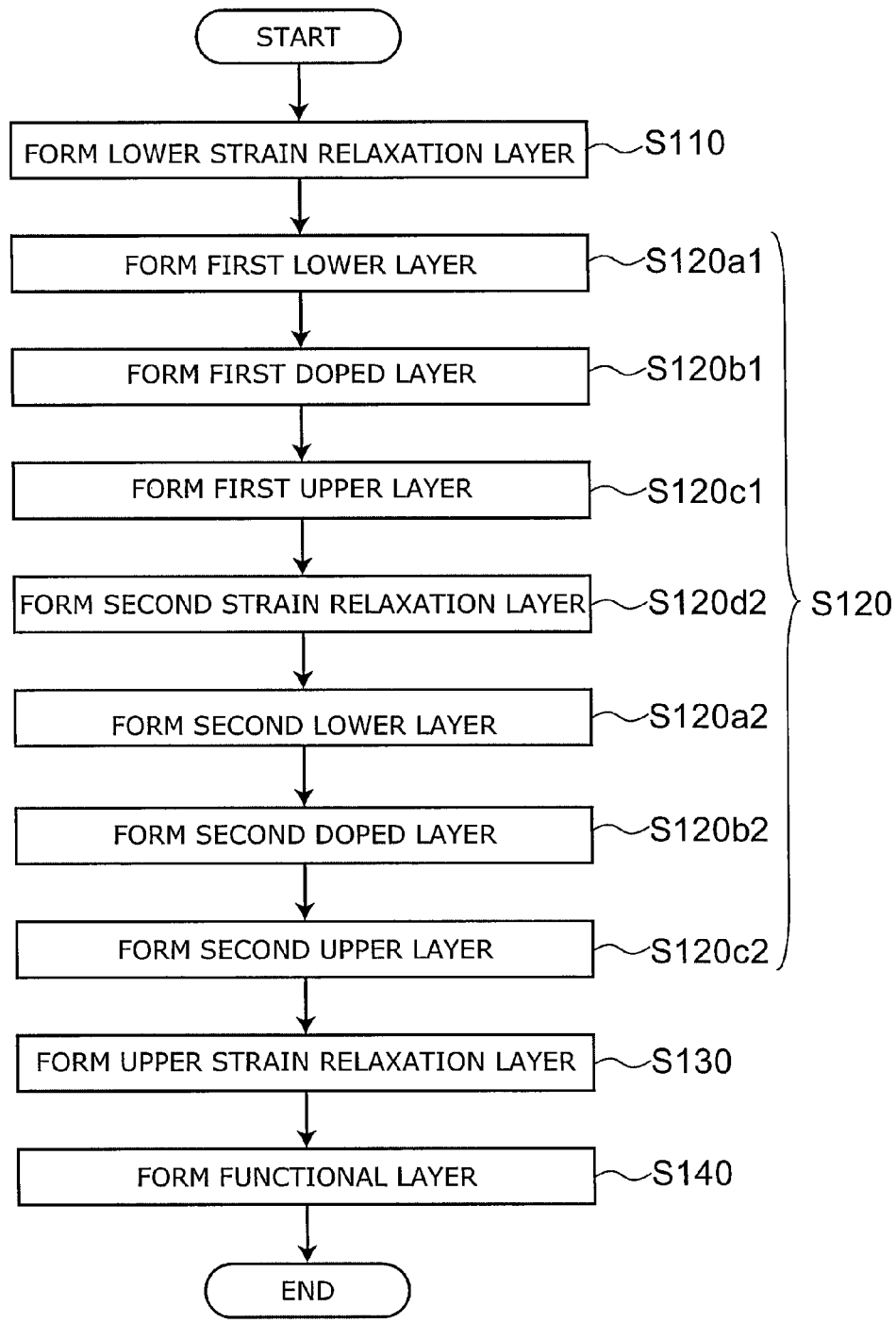
FIG. 10 is a flow chart illustrating the method for growing a nitride semiconductor crystal according to the second embodiment.

FIG. 10 is a flow chart illustrating the method for growing a nitride semiconductor crystal according to the second embodiment.

As shown in FIG. 10, the formation of the intermediate layer 55 (step S120) further includes forming a second lower layer LA2 on the first upper layer LC1 (step S120a2), forming a second doped layer LB2 on the second lower layer LA2 (step S120b2), and forming a second upper layer LC2 on the second doped layer LB2 (step S120c2). As described above, the second lower layer LA2 includes a nitride semiconductor having a lattice constant smaller than the lattice constant of the first upper layer LC1. The second doped layer LB2 includes a nitride semiconductor having a lattice constant larger than or equal to the lattice constant of the second lower layer LA2, and containing impurity at a concentration of $1 \times 10^{18}$ cm$^{-3}$ or more and less than $1 \times 10^{21}$ cm$^{-3}$. The second upper layer LC2 includes a nitride semiconductor having a lattice constant larger than or equal to the lattice constant of the second doped layer LB2 and larger than the lattice constant of the second lower layer LA2.

As shown in FIG. 10, the formation of the intermediate layer 55 can further include further forming a second strain relaxation layer LD2 provided between the first upper layer LC1 and the second lower layer LA2 (step S120d2). The second strain relaxation layer LD2 includes a nitride semiconductor having a lattice constant smaller than the lattice constant of the second lower layer LA2. As the second strain relaxation layer LD2, for instance, $Al_{z2}Ga_{1-z2}N$ ($0 < z2 \leq 1$) is formed.

The second lower layer LA2 includes $Al_{xa2}In_{ya2}Ga_{1-xa2-ya2}N$ ($0 \leq xa2 < 1$, $0 \leq ya2 < 1$, $xa2+ya2 \leq 1$). The second doped layer LB2 includes $Al_{xb2}In_{yb2}Ga_{1-xb2-yb2}N$ ($0 \leq xb2 < 1$, $0 \leq yb2 < 1$, $xb2+yb2 \leq 1$). The second upper layer LC2 includes $Al_{xc2}In_{yc2}Ga_{1-xc2-yc2}N$ ($0 \leq xc2 < 1$, $0 \leq yc2 < 1$, $xc2+yc2 \leq 1$).

For instance, the second lower layer LA2 includes $Al_{xa2}Ga_{1-xa2}N$ ($0 < xa2 \leq 1$). The second doped layer LB2 includes $Al_{xb2}Ga_{1-xb2}N$ ($0 < xb2 < xa2$). The second upper layer LC2 includes $Al_{xc2}Ga_{1-xc2}N$ ($0 \leq xc2 < xb2$).

Thus, in the growth method according to the embodiment, the formation of the intermediate layer 55 includes stacking a plurality of stacked films.

Third Embodiment

The third embodiment relates to a nitride semiconductor device.

The nitride semiconductor device according to the embodiment includes e.g. a semiconductor light emitting device, a semiconductor light receiving device, and an electronic device. The nitride semiconductor device according to the embodiment can be manufactured based on the wafer according to the first embodiment.

Figure 11:
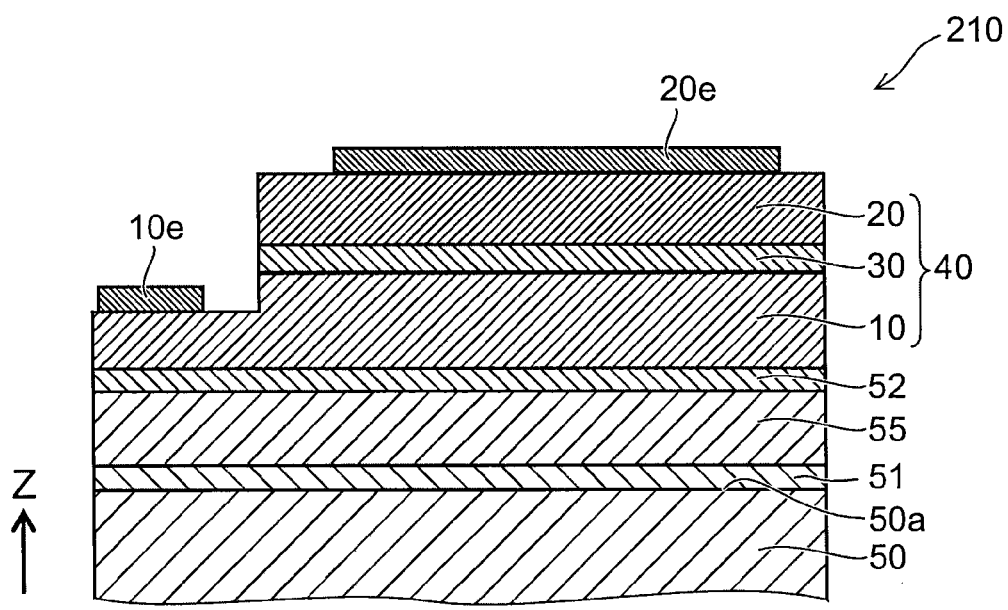
FIG. 11 is a schematic sectional view illustrating a nitride semiconductor device according to a third embodiment.

FIG. 11 is a schematic sectional view illustrating the configuration of a nitride semiconductor device according to the third embodiment.

As shown in FIG. 11, the nitride semiconductor device 210 according to the embodiment includes an intermediate layer 55 formed on the major surface 50a of a silicon substrate and including a nitride semiconductor, an upper strain relaxation layer 52 provided on the intermediate layer 55 and including a nitride semiconductor layer, and a functional layer provided on the upper strain relaxation layer 52 and including a nitride semiconductor. The intermediate layer 55 includes a first lower layer LA1, a first doped layer LB1, and a first upper layer LC1. The first lower layer LA1 is formed on the major surface 50a of the silicon substrate 50 and including a nitride semiconductor. The first doped layer LB1 is provided on the first lower layer LA1. The first doped layer LB1 includes a nitride semiconductor having a lattice constant larger than or equal to the lattice constant of the nitride semiconductor of the first lower layer LA1, and containing impurity at a concentration of $1 \times 10^{18}$ cm$^{-3}$ or more and less than $1 \times 10^{21}$ cm$^{-3}$. The first upper layer LC1 is provided on the first doped layer LB1. The first upper layer LC1 includes a nitride semiconductor having a lattice constant larger than or equal to the lattice constant of the nitride semiconductor of the first doped layer LB1 and larger than the lattice constant of the nitride semiconductor of the first lower layer LA1.

In this example, the nitride semiconductor device 210 further includes a lower strain relaxation layer 51. The lower strain relaxation layer 51 is provided between the silicon substrate 50 and the first lower layer LA1. The lattice constant of the lower strain relaxation layer 51 is smaller than the lattice constant of the first lower layer LA1.

In this example, the nitride semiconductor device 210 further includes the silicon substrate 50. However, the embodiment is not limited thereto. The silicon substrate 50 may be removed after the intermediate layer 55, the upper strain relaxation layer 52, and the functional layer 40 are formed on the silicon substrate 50. At this time, for instance, at least part of the lower strain relaxation layer 51 may be removed.

In this example, the functional layer 40 includes a first semiconductor layer 10 provided on the upper strain relaxation layer 52, including a nitride semiconductor, and having a first conductivity type (e.g., n-type), a second semiconductor layer 20 provided on the first semiconductor layer 10, including a nitride semiconductor, and having a second conductivity type (e.g., p-type) different from the first conductivity type, and a light emitting section 30 provided between the first semiconductor layer 10 and the second semiconductor layer 20. The light emitting section 30 includes e.g. a plurality of barrier layers 31 and a well layer 32 provided between the plurality of barrier layers 31.

The nitride semiconductor device 210 is a semiconductor light emitting device. More specifically, the nitride semiconductor device 210 is an LED (light emitting diode).

In the nitride semiconductor device 210, the light emitting section 30 is provided on part of the first semiconductor layer 10, and the second semiconductor layer 20 is provided on the light emitting section 30. A first electrode 10e is provided on the first semiconductor layer 10, and a second electrode 20e is provided on the second semiconductor layer 20. If a voltage is applied between the first electrode 10e and the second electrode 20e, holes and electrons recombine in the light emitting section 30, and light is emitted from the light emitting section 30. This light is extracted from the surface on the second semiconductor layer 20 side as viewed from the light emitting section 30, or the surface on the first semiconductor layer 10 side as viewed from the light emitting section 30.

The nitride semiconductor device 210 can provide a nitride semiconductor device formed on a silicon substrate and having few dislocations and cracks. By the reduction of dislocation density and cracks, for instance, the light emission efficiency is increased. Furthermore, the reliability can be improved.

Figure 12:
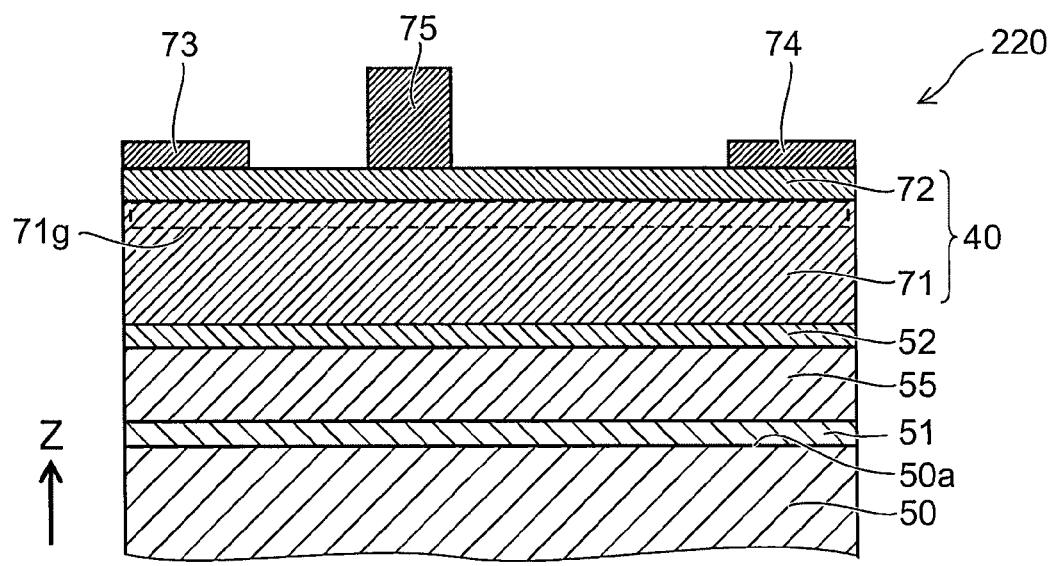
FIG. 12 is a schematic sectional view illustrating an alternative nitride semiconductor device according to the third embodiment.

FIG. 12 is a schematic sectional view illustrating the configuration of an alternative nitride semiconductor device according to the third embodiment.

As shown in FIG. 12, the alternative nitride semiconductor device 220 according to the embodiment also includes an intermediate layer 55, an upper strain relaxation layer 52, and a functional layer 40. In this example, the functional layer 40 includes a first semiconductor layer 71 provided on the upper strain relaxation layer 52, and a second semiconductor layer 72 provided on the first semiconductor layer 71. The bandgap energy of the second semiconductor layer 72 is larger than the bandgap energy of the first semiconductor layer 71.

The first semiconductor layer 71 serves as a channel layer. The second semiconductor layer 72 serves as a barrier layer. The second semiconductor layer 72 forms heterojunction with the first semiconductor layer 71. The intermediate layer 55, the upper strain relaxation layer 52, the first semiconductor layer 71, and the second semiconductor layer 72 are epitaxially grown in this order on the major surface of a silicon substrate 50.

The first semiconductor layer 71 includes e.g. undoped $Al_\alpha Ga_{1-\alpha}N$ ($0 \leq \alpha \leq 1$) not containing impurity. The second semiconductor layer 72 includes e.g. undoped or n-type $Al_\beta Ga_{1-\beta}N$ ($0 \leq \beta \leq 1$, $\alpha < \beta$). For instance, the first semiconductor layer 71 is an undoped GaN layer, and the second semiconductor layer 72 is an undoped or n-type AlGaN layer. The upper strain relaxation layer 52 is e.g. an AlN layer or AlGaN layer.

On the second semiconductor layer 72, a source electrode 73 and a drain electrode 74 are provided and spaced from each other. The source electrode 73 and the drain electrode 74 are each in ohmic contact with the surface of the second semiconductor layer 72. A gate electrode 75 is provided on the second semiconductor layer 72 between the source electrode 73 and the drain electrode 74. The gate electrode 75 is in Schottky contact with the surface of the second semiconductor layer 72.

The lattice constant of the second semiconductor layer 72 is smaller than the lattice constant of the first semiconductor layer 71. This generates strain in the second semiconductor layer 72. Thus, by the piezoelectric effect, a piezoelectric polarization occurs in the second semiconductor layer 72. This forms a two-dimensional electron gas 71g near the interface with the second semiconductor layer 72 in the first semiconductor layer 71.

In the nitride semiconductor device 220, by controlling the gate voltage applied to the gate electrode 75, the concentration of the two-dimensional electron gas 71g below the gate electrode 75 is increased or decreased. Thus, the current flowing between the source electrode 73 and the drain electrode 74 is controlled. The nitride semiconductor device 220 is a HEMT (high electron mobility transistor).

The nitride semiconductor device 220 can provide a nitride semiconductor device formed on a silicon substrate and having few dislocations and cracks. By the reduction of dislocation density and cracks, the performance is stabilized. Furthermore, the reliability can be improved.

In the embodiment, growth of semiconductor layers can be based on e.g. the metal-organic chemical vapor deposition (MOCVD) method, metal-organic vapor phase epitaxy (MOVPE) method, molecular beam epitaxy (MBE) method, and halide vapor phase epitaxy (HVPE) method.

For instance, in the case of using the MOCVD method or MOVPE method, the following source materials can be used in forming each semiconductor layer. For instance, TMGa (trimethylgallium) and TEGa (triethylgallium) can be used as Ga source. TMIn (trimethylindium) and TEIn (triethylindium), in the other hand, can be used as In source. As source material of Al, for instance, TMAl (trimethylaluminum) can be used. As for nitrogen source, for instance, NH$_3$ (ammonia), MMHy (monomethylhydrazine), and DMHy (dimethylhydrazine) can be used.

The source of the impurity can be based on the following, for instance. Silane (SiH$_4$), bis(cyclopentadienyl)magnesium (Cp$_2$Mg) can be used as Si and Mg source, respectively. In the other hand, tricarbonylmanganese (MMT) can be used as Mn source. As source material of Fe, for instance, iron carbonyl ($Fe(CO)_5$) and ferrocene ($Cp_2Fe$) can be used. As for source material of oxygen (O), for instance, oxygen plasma can be used.

According to the embodiments, a nitride semiconductor wafer, a nitride semiconductor device, and a method for growing a nitride semiconductor crystal, on a silicon substrate and with few dislocations and cracks are provided.

In the description, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the composition ratios x, y, and z varied in the respective ranges. Furthermore, the "nitride semiconductor" also includes those of the above chemical formula further containing Group V elements other than N (nitrogen), those further containing various elements added for controlling various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the embodiments of the invention are not limited to these examples. For instance, any specific configurations of various components such as the silicon substrate, lower strain relaxation layer, intermediate layer, upper strain relaxation layer, functional layer, lower layer, doped layer, and upper layer included in the nitride semiconductor wafer or the nitride semiconductor device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the nitride semiconductor wafer, the nitride semiconductor device, and the method for growing a nitride semiconductor crystal described above in the embodiments of the invention. All the nitride semiconductor wafers, the nitride semiconductor devices, and the methods for growing a nitride semiconductor crystal thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
    an intermediate layer formed on a major surface of a silicon substrate and including a nitride semiconductor;
    an upper strain relaxation layer provided on the intermediate layer and including a nitride semiconductor; and
    a functional layer provided on the upper strain relaxation layer and including a nitride semiconductor,
    the intermediate layer including:
        a first lower layer formed on the major surface and including a nitride semiconductor;
        a first doped layer provided on the first lower layer and including a nitride semiconductor, the first doped layer having a lattice constant larger than or equal to lattice constant of the first lower layer and containing an impurity at a concentration of $1 \times 10^{18}$ cm$^{-3}$ or more and less than $1 \times 10^{21}$ cm$^{-3}$; and
        a first upper layer provided on the first doped layer and including a nitride semiconductor, the first upper layer having a lattice constant larger than or equal to the lattice constant of the first doped layer and larger than the lattice constant of the first lower layer.

2. The device according to claim 1, wherein the functional layer includes:
    a first semiconductor layer provided on the upper strain relaxation layer, including a nitride semiconductor, and having a first conductivity type;
    a second semiconductor layer provided on the first semiconductor layer, including a nitride semiconductor, and having a second conductivity type different from the first conductivity type; and
    a light emitting section provided between the first semiconductor layer and the second semiconductor layer and including a plurality of barrier layers and a well layer provided between the plurality of barrier layers.

3. The device according to claim 1, wherein the functional layer includes:
    a first semiconductor layer provided on the upper strain relaxation layer; and
    a second semiconductor layer provided on the first semiconductor layer, the second semiconductor layer having a band gap energy larger than a band gap energy of the first semiconductor layer.

4. The device according to claim 1, wherein
    a composition ratio of the first doped layer is different from a composition ratio of the first lower layer, and also different from a composition ratio of the first upper layer, and
    the lattice constant of the first doped layer is larger than the lattice constant of the first lower layer, and smaller than the lattice constant of the first upper layer.

5. The device according to claim 1, wherein the impurity includes at least one of silicon (Si), magnesium (Mg), manganese (Mn), iron (Fe), oxygen (O), and carbon (C).

6. The device according to claim 1, wherein the intermediate layer further includes:
    a second lower layer provided on the first upper layer and including a nitride semiconductor, the second lower layer having a lattice constant smaller than the lattice constant of the first upper layer;
    a second doped layer provided on the second lower layer and including a nitride semiconductor, the second doped layer having a lattice constant larger than or equal to the lattice constant of the second lower layer and containing an impurity at a concentration of $1 \times 10^{18}$ cm$^{-3}$ or more and less than $1 \times 10^{21}$ cm$^{-3}$; and
    a second upper layer provided on the second doped layer and including a nitride semiconductor, the second upper layer having a lattice constant larger than or equal to the lattice constant of the second doped layer and larger than the lattice constant of the second lower layer.

7. The device according to claim 1, wherein
a first density of dislocations extending in a direction from the first lower layer toward the first upper layer in the functional layer is lower than a second density of dislocations extending in the direction in the first lower layer.

* * * * *